(12) United States Patent
Kunihiro

(10) Patent No.: US 8,670,731 B2
(45) Date of Patent: Mar. 11, 2014

(54) POWER AMPLIFICATION APPARATUS AND POWER AMPLIFICATION METHOD

(75) Inventor: Kazuaki Kunihiro, Tokyo (JP)

(73) Assignee: NEC Corporation, Tokyo (JP)

( * ) Notice: Subject to any disclaimer, the term of this patent is extended or adjusted under 35 U.S.C. 154(b) by 478 days.

(21) Appl. No.: 12/999,984

(22) PCT Filed: Jun. 25, 2009

(86) PCT No.: PCT/JP2009/061620
§ 371 (c)(1),
(2), (4) Date: Dec. 17, 2010

(87) PCT Pub. No.: WO2010/001806
PCT Pub. Date: Jan. 7, 2010

(65) Prior Publication Data
US 2011/0090008 A1   Apr. 21, 2011

(30) Foreign Application Priority Data

Jun. 30, 2008   (JP) ................. 2008-170907

(51) Int. Cl.
*H01Q 11/12*   (2006.01)
*H04B 1/04*   (2006.01)

(52) U.S. Cl.
USPC ..................................... 455/127.1

(58) Field of Classification Search
USPC ............... 455/102, 108, 110, 127.1, 127.2
See application file for complete search history.

(56) References Cited

U.S. PATENT DOCUMENTS 5,905,407 A   5/1999 Midya
5,973,556 A   10/1999 Su
6,710,646 B1   3/2004 Kimball
2007/0184796 A1*   8/2007 Drogi et al. ............. 455/127.1
2009/0068966 A1*   3/2009 Drogi et al. ............. 455/127.1
2010/0311365 A1*   12/2010 Vinayak et al. ......... 455/127.1

FOREIGN PATENT DOCUMENTS

| JP | 57-68908 A | 4/1982 |
| JP | 7-283656 A | 10/1995 |
| JP | 10-150329 A | 6/1998 |
| JP | 3207153 B | 9/2001 |
| JP | 2003526980 A | 9/2003 |
| JP | 2003324323 A | 11/2003 |

(Continued)

OTHER PUBLICATIONS

International Search Report for PCT/JP2009/061620 mailed Aug. 4, 2009.

(Continued)

*Primary Examiner* — Nguyen Vo
(74) *Attorney, Agent, or Firm* — Sughrue Mion, PLLC

(57) ABSTRACT

Disclosed is a power amplifier apparatus including: an amplifier amplifying an input modulated signal; a control signal generator receiving an amplitude component of the input modulated signal and generating a control signal; and a power combiner performing ON/OFF control of a switching element based on the control signal to control conduction and non-conduction of a current supplied from a second power supply. In the power combiner, a power of a pulsed form when the current from the second power supply is conductive is transferred in a direction of a first power supply, using a transformer. A difference power obtained by subtracting a constant value from a first power supply voltage when the amplitude of the input modulated signal is smaller than that of a reference signal is supplied from the power combiner to the amplifier, as a power supply thereof (FIG. 1).

25 Claims, 16 Drawing Sheets

(56) References Cited

FOREIGN PATENT DOCUMENTS

| | | | |
|---|---|---|---|
| JP | 2005-192067 A | 7/2005 |
| JP | 2007036473 A | 2/2007 |
| JP | 2007514311 A | 5/2007 |
| WO | 03103134 A | 12/2003 |
| WO | 2006114792 A | 11/2006 |
| WO | 2007080741 A | 7/2007 |
| WO | 2010/073942 A1 | 7/2010 |
| WO | 2010/089971 A1 | 8/2010 |

OTHER PUBLICATIONS

L. R. Kahn, "Single-Sideband Transmission by Envelope Elimination and Restoration", Proceedings of the I.R.E, 1952, pp. 803-806.

J. Staudinger et al,. "High Efficiency CDMA RF Power Amplifier Using Dynamic Envelope Tracking Technique", Microwave Symposium Digest, 2000 IEEE MTT-S Digest, WE3A-6, vol. 2, 2000, pp. 873-876.

Japanese Office Action for JP Application No. 2010-519023 mailed on Jul. 2, 2013 with English Translation.

* cited by examiner

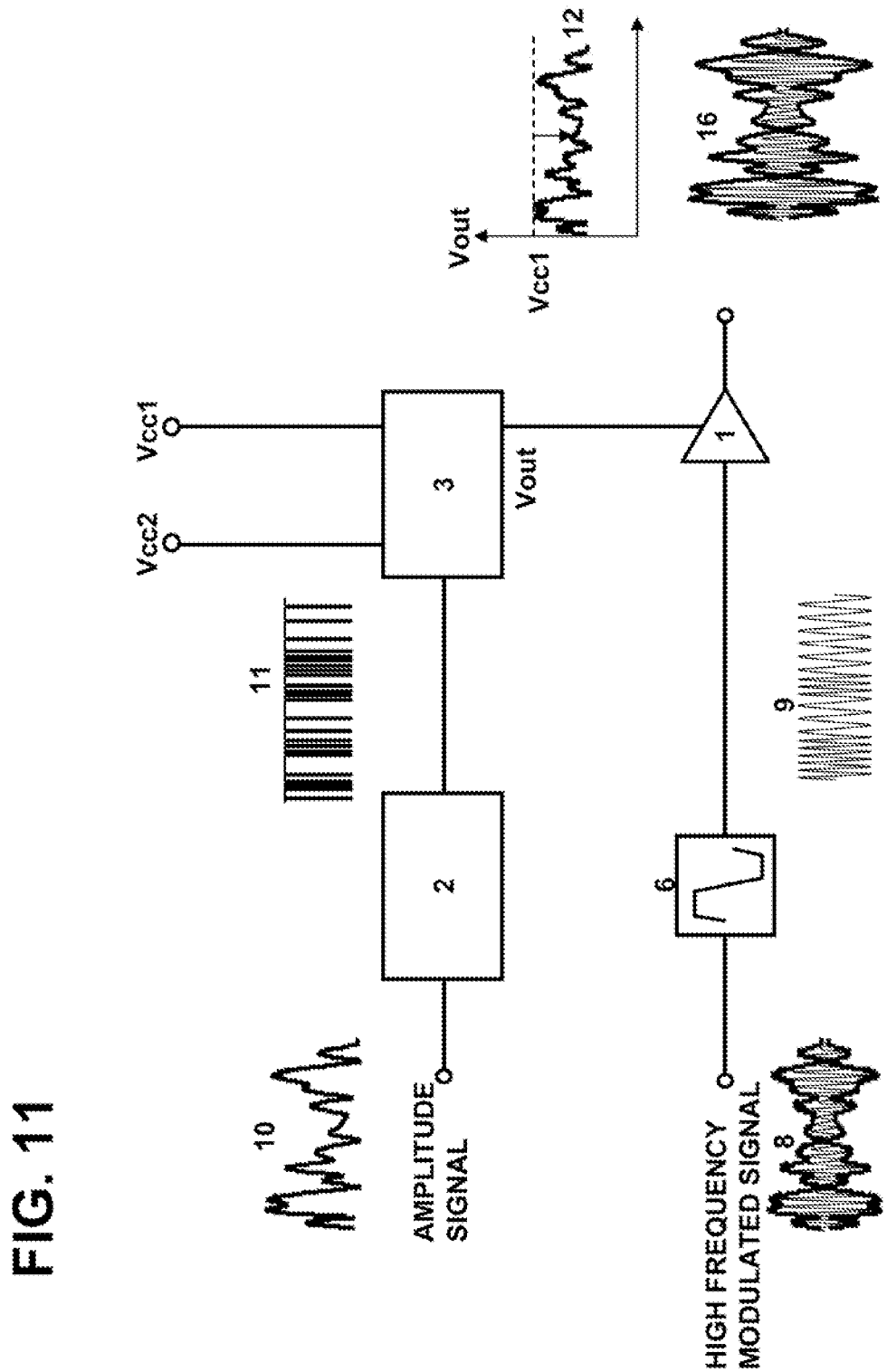

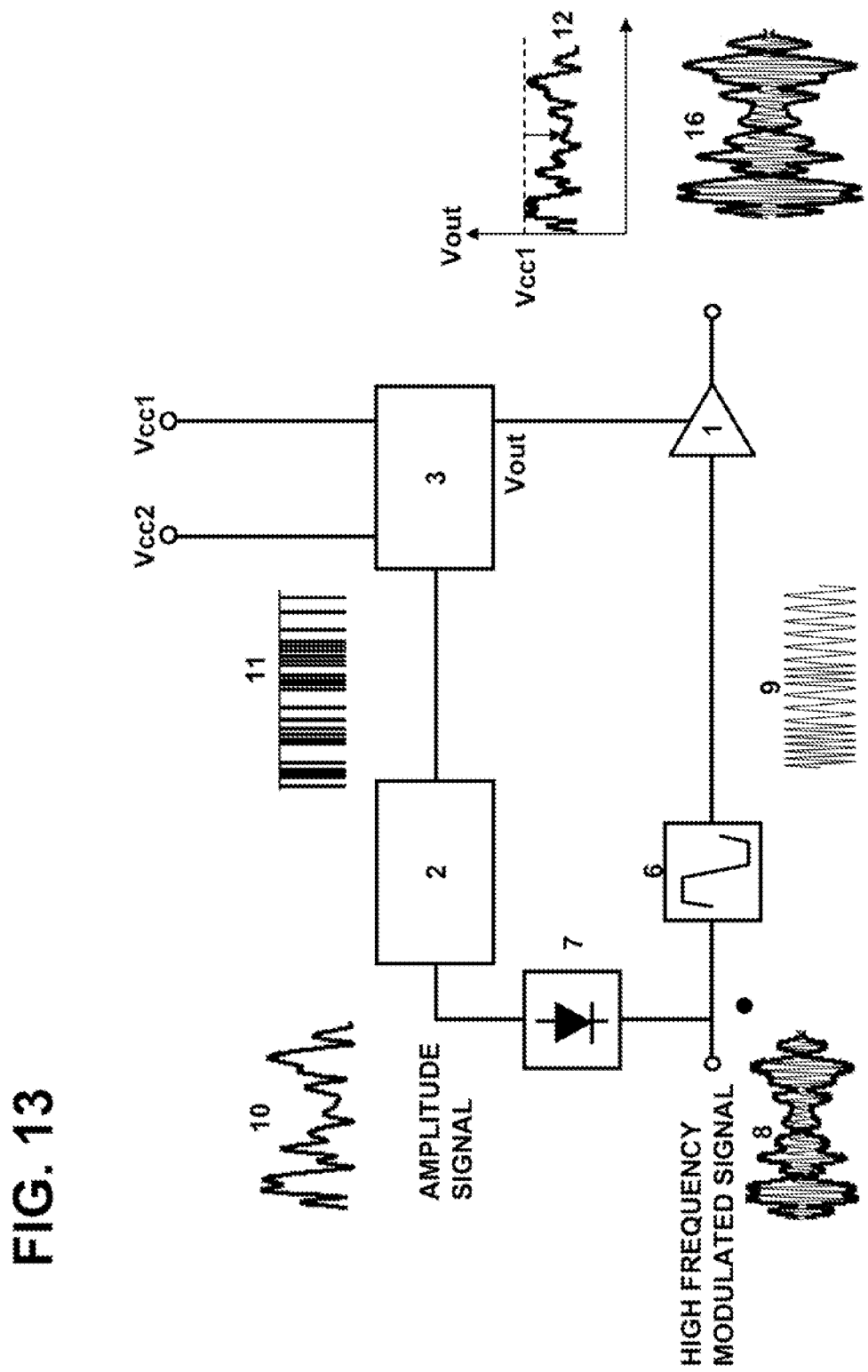

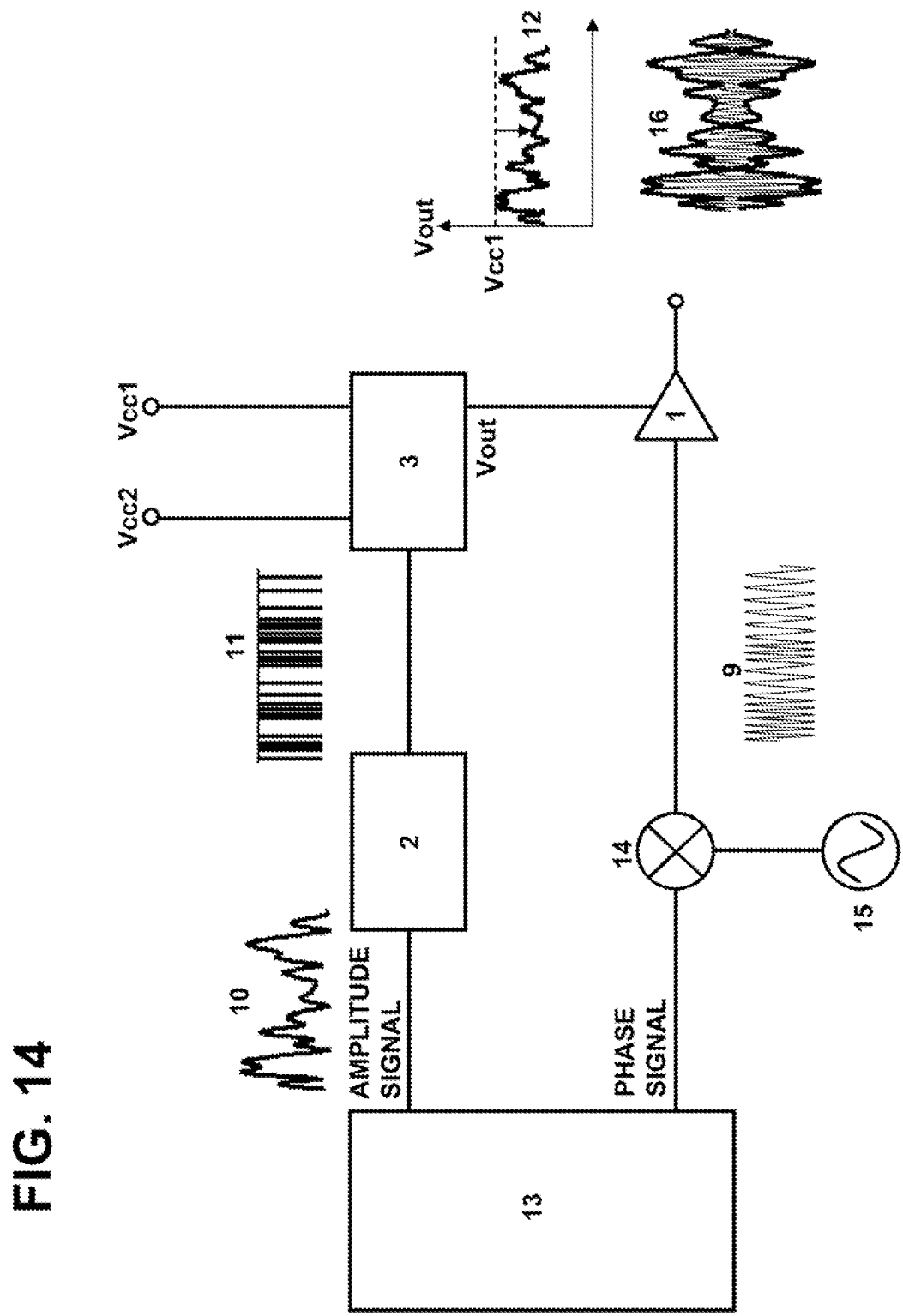

RELATED ART

POWER AMPLIFICATION APPARATUS AND POWER AMPLIFICATION METHOD

REFERENCE TO RELATED APPLICATION

This application is the National Phase of PCT/JP2009/061620, filed Jun. 25, 2009, which is based upon and claims the benefit of the priority of Japanese patent application No. 2008-170907 filed on Jun. 30, 2008, the disclosure of which is incorporated herein in its entirety by reference thereto.

TECHNICAL FIELD

The present invention relates to a power amplification apparatus, and in particular, to a power amplification apparatus having a function of varying a power supply voltage in accordance with the size of the amplitude of an input modulated signal, and a method therefor.

BACKGROUND

In digital modulation schemes used in recent years in wireless communications, such as mobile telephony and LAN (Local Area Network), a modulation format such as QPSK (Quadrature Phase Shift Keying) and QAM (Quadrature Amplitude Modulation) is employed.

In this type of modulation format, generally a signal trajectory undergoes amplitude modulation at a time of inter-symbol transition, and a high frequency modulation signal superimposed on a carrier signal of a microwave band has a signal amplitude (envelope) which changes with time. A ratio of a peak power and an average power of a high frequency modulation signal is referred to as PAPR Peak-to-Average Power Ratio).

In order to ensure high linearly, an amplifier which amplifies a signal with a large PAPR needs to be supplied with sufficiently large power from a power supply, so that a waveform of the signal is not distorted even at a peak power. In other words, it is necessary to operate the amplifier in a region of power sufficiently lower than saturation power limited by a power supply voltage, with power margin (back off).

In general, since a linear amplifier which operates in class A or B, has the maximum efficiency in a vicinity of a saturation power, an average efficiency is lowered when the linear amplifier operates in a region where the back off is large.

In an Orthogonal Frequency Division Multiplexing (OFDM) system using a multicarrier employed in next generation Mobile telephony, wireless LAN, and digital television broadcasting, PAPR is further increased, and an average efficiency of an amplifier is further lowered.

Therefore, it is desirable that a characteristic of an amplifier has a high efficiency even in a power region with a large back off.

As a system for amplifying a signal with high efficiency and with a wide dynamic range in a power region with a large back off, a transmission system referred to as Envelope Elimination and Restoration (EER) is proposed by L. Kan in Non-Patent Document 1 (Proceedings of the I.R.E, pages 803-806, 1952). In this system, first an input modulated signal is separated into a phase component and an amplitude component thereof. The phase component with a constant amplitude is supplied to the amplifier while maintaining phase modulation. At this time, a high frequency amplifier operates in the vicinity of saturation at which efficiency is always largest.

On the other hand, the amplitude component undergoes power amplification with high efficiency using a class D amplifier or the like, while maintaining amplitude modulation, and the amplitude component is supplied as intensity modulated power (modulated power supply) to the amplifier.

When operated in this way, the amplifier operates as a multiplier, the phase component and the amplitude component of the modulated signal are combined, and an output modulated signal amplified with high efficiency not depending on the back off, is obtained.

As a system that resembles the EER scheme, a method referred to as Envelope Tracking (ET) is also known. For example, in Non-Patent Document 2 (Microwave Symposium Digest, 2000 IEEE MITTS Digest, Vol. 2, FIG. 1, pp. 873-876), an example thereof is reported.

The ET scheme has in common with the EER scheme a configuration in which an amplitude component of an input modulated signal is power-amplified with high efficiency using such as a class D amplifier, while maintaining amplitude modulation and is supplied as modulated power to the amplifier.

A point of difference is that in the EER scheme only a phase modulated signal with amplitude constant is supplied to the amplifier and saturation operation performed, whereas in the ET scheme the input modulated signal including both the amplitude modulation and the phase modulation is as it is supplied to the amplifier which operates linearly.

In the ET scheme, since the amplifier operates linearly, efficiency is lower than in the EER scheme. However, since only the minimum necessary power is supplied, in accordance with an amplitude size, the ET scheme can obtain a high efficiency, as compared to a case of using the amplifier at a constant voltage not depending on an amplitude.

The ET scheme has an advantage in that a timing margin in which an amplitude component and a phase component are combined, is relaxed, and the implementation is easier in comparison with the EER scheme.

In the EER scheme and the ET scheme, an amplitude component is converted to a pulse modulation signal, and switching amplification is performed using a class D amplifier or the like.

Regarding a pulse modulation scheme, a pulse width modulation (PWM) scheme has been generally used. In Patent Document 1 and Patent Document 2, a configuration is proposed in which a delta modulation scheme (or a Pulse Density Modulation (PDM) scheme), which is superior in linearity, is applied.

In recent years, a sigma-delta modulation scheme or the like, in which Signal to Noise Ratio (SNR) is enhanced, has been used.

In wireless communication systems using digital modulation in recent years, such as mobile telephony and the like, standards have been set in which Adjacent Channel Leakage Power Ratio (ACPR) and Error Vector Magnitude (EVM) representing modulation error should be kept at or below a constant value.

In the EER scheme and the ET scheme, an operation frequency band of a class D amplifier or pulse modulator forming a modulation power supply must at least be twice or more as large as a band of a modulated signal, in order to satisfy the specifications.

For example, in mobile phone WCDMA (Wideband Code Division Multiple Access) specifications, the modulation band is approximately 5 MHz. In the IEEE 802.11a/g standards for wireless LAN, the modulation band is approximately 20 MHz.

In general, since high power and high speed switching amplification is difficult to implement, it is difficult to realize such a wide band modulation power supply.

A configuration shown in FIG. 15 is proposed in Patent Document 3 as a simplest method of modulating power supplied to the amplifier in accordance with an amplitude component of a modulated signal.

This method includes supplying steadily an average power (voltage) to an amplifier, and supplying excess power (voltage) to the amplifier only when an amplitude becomes greater than or equal to a fixed value.

Operation of this method will be described using FIG. 15 and FIG. 16. In this method, a voltage Bc is steadily applied to an amplifier (RF AMP) 204. The voltage Bc is lower than an output peak voltage because the average power is provided.

When an envelope sensor (EES) 201 detects a peak at which an envelope (amplitude component) 10 of an input modulated signal is higher than a reference voltage Vref, a power valve 203 is turned ON, and an excess voltage Bv is applied to the amplifier 204.

As a configuration of the power valve 203, a method using capacitive coupling is proposed in Patent Document 4, and a method having combined usage of capacitive coupling and magnetic coupling is proposed in Patent Document 5.

With this type of configuration, an unnecessary power is not supplied in a region where the amplitude component of the input modulated signal is small, and it is possible to increase average efficiency of the amplifier.

Patent Document 1

JP Patent No. 3207153 (page 8, FIG. 3)

Patent Document 2

U.S. Pat. No. 5,973,556 (page 3, FIG. 3)

Patent Document 3

JP Patent Kohyo Publication No. JP-P2003-526980 (page 30, FIG. 2A)

Patent Document 4

International Publication No. 03/103134 pamphlet (page 2/2, FIG. 2)

Patent Document 5

International Publication No. 2006/114792 pamphlet (page 3/3, FIG. 3)

Non-Patent Document 1

Proceedings of the I.R.E. (1952, Vol. 40, pp. 803-806, FIG. 2)

Non-Patent Document 2

IEEE MTT-S Digest (2000, Vol. 2, pp. 873-876, FIG. 1)

SUMMARY

The entire disclosures of Patent Documents 1-5 and Non-Patent Documents 1 and 2 are incorporated herein by reference thereto. The following analysis is given by the present invention.

An analysis is provided below of related technology according to the present invention.

In a method described making reference to FIG. 15 and FIG. 16, when consideration is given to an entire system, it is necessary to newly add a voltage conversion circuit (DC-DC converter 210 or the like) in order to generate an average voltage (Bc in FIG. 15) from a primary voltage Vcc1.

There has been a problem in that since efficiency of the voltage conversion circuit is not 100% and has a constant power loss, efficiency in the entire system does not necessarily improve.

For example, in a base station for mobile telephones, a device voltage is given by DC +48V.

At present, this voltage is stepped down by a DC-DC converter to Vcc1=+28V, and applied to an amplifier formed by LDMOS (Laterally Doped MOS).

On this occasion, the efficiency of the DC-DC converter is typically 90% to 93%.

In a configuration shown in FIG. 15, further stepping down is necessary, from Vcc1=+28V to, as an average voltage, for example Bc=+12V. Therefore, if another DC-DC converter 210 is used in series, not only does the number of parts increase, but efficiency decreases, due to losses of two DC-DC converters, overall to approximately 90%×90%=81%.

As a result, amplifier efficiency improvement due to a principle of this method is cancelled out, and in some cases, the efficiency of the entire system may decrease.

It is possible to use a DC-DC converter which directly generates +12V from +48V. However, a DC-DC converter tends to decrease the more, the larger the difference there is between a primary voltage and a secondary voltage. Additional man-hours are required in procurement or development of new parts.

There is a plan in the future to operate the amplifier directly at +48V, by causing LDMOS to have a high withstand voltage, or by using a high withstand voltage amplifier that uses a wide-gap semiconductor, such as gallium nitride (GaN).

In this case, since a DC-DC converter is not necessary, it is expected that the efficiency will increase by that amount. However, in a case of using the method described with reference to FIG. 15 and FIGS. 16A-16C, since another DC-DC converter 210 which steps down to the average voltage Bc is necessary, a loss occurs due to the DC-DC converter.

With an amplifier for use in a digital television broadcasting station also, a device voltage is given as AC 200V, and this device voltage is stepped down to approximately 50V by an AC-DC converter and then applied to the amplifier. As a result, a problem similar to the above mentioned problem occurs.

Therefore, it is an object of the present invention to provide a high efficiency power amplification apparatus having a function of varying a power supply voltage in accordance with an amplitude size of an input modulated signal, and a power amplification method.

The invention disclosed in the present application has a configuration as outlined below, though not limited thereto. It is to be noted that reference numerals inside parentheses are only for facilitating understanding of a configuration of the present invention, and are not to be used for interpreting the present invention in a limiting manner.

According to a first aspect of the present invention, there is provided a power amplification apparatus having means (1 in FIG. 1) for linearly amplifying an input modulated signal, means (2 in FIG. 1) for sampling a signal when an amplitude intensity of the input modulated signal is less than or equal to a predetermined prescribed value, and means (3 in FIG. 1) for supplying, to an amplifier, a difference power obtained by amplifying the sampled signal using a second power supply, and transferring the amplified power in one direction toward a first power supply.

Alternatively, according to the present invention, there is provided a power amplification apparatus having means (1 in FIG. 6) for linearly amplifying an input modulated signal, means (2 in FIG. 6) for sampling and pulse-modulating a signal obtained by inverting a change of an amplitude intensity of the input modulated signal, and means (3 in FIG. 6) for supplying, to an amplifier, a difference power obtained by using a second power supply to amplify the pulse-modulated signal, and transferring the amplified power in one direction toward a first power supply. The amplitude signal of the input modulated signal is supplied to the means (2 in FIG. 6) for pulse modulation through a low pass filter (4 in FIG. 6).

Alternatively, according to the present invention, there is provided a power amplification apparatus having means (1 in FIG. 11) for amplifying a phase component of an input modulated signal, means (2 in FIG. 11) for sampling and pulse-modulating a signal obtained by inverting a change of an amplitude intensity of the input modulated signal, and means (3 in FIG. 11) for supplying, to an amplifier, a difference power obtained by using a second power supply to amplify the pulse-modulated signal, and transferring the amplified power in one direction toward a first power supply. The input modulated signal is supplied to the amplifier through a limiter (6 in FIG. 11).

A method according to the present invention includes each of the following steps:

(a) deciding whether an amplitude component of an input modulated signal is larger or smaller than a reference signal, and generating a control signal taking a first or a second value corresponding to whether the amplitude component is larger or smaller than the reference signal, (b) amplifying a power in a pulse form when the amplitude component of the input modulated signal is smaller than the reference signal, by performing ON/OFF control of a switching element connected to the second power supply with the control signal, and (c) by transferring a power, on which the switching amplification has been performed, in one direction on the first power supply side, obtaining a difference power obtained by subtracting a power supplied in excess when the amplitude component of the input modulated signal is smaller than the reference signal, from a power supplied from the first power supply, and (d) providing the difference power as a power supply of the amplifier for amplifying the input modulated signal.

According to the present invention, it is possible to amplify with high efficiency an input signal having amplitude and phase modulated. A reason for this is that, in an amplification device according to the present invention, by changing the size of power supplied in accordance with change of an amplitude of an input modulated signal, excess power is not supplied when the amplitude is small, and only a minimum necessary power is constantly supplied to the amplifier.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 11 is a diagram showing a configuration in a third exemplary embodiment of the present invention.

FIG. 13 is a diagram showing a configuration in a fourth exemplary embodiment of the present invention.

FIG. 14 is a diagram showing a configuration in a fifth exemplary embodiment of the present invention.

PREFERRED MODES

Figure 1:
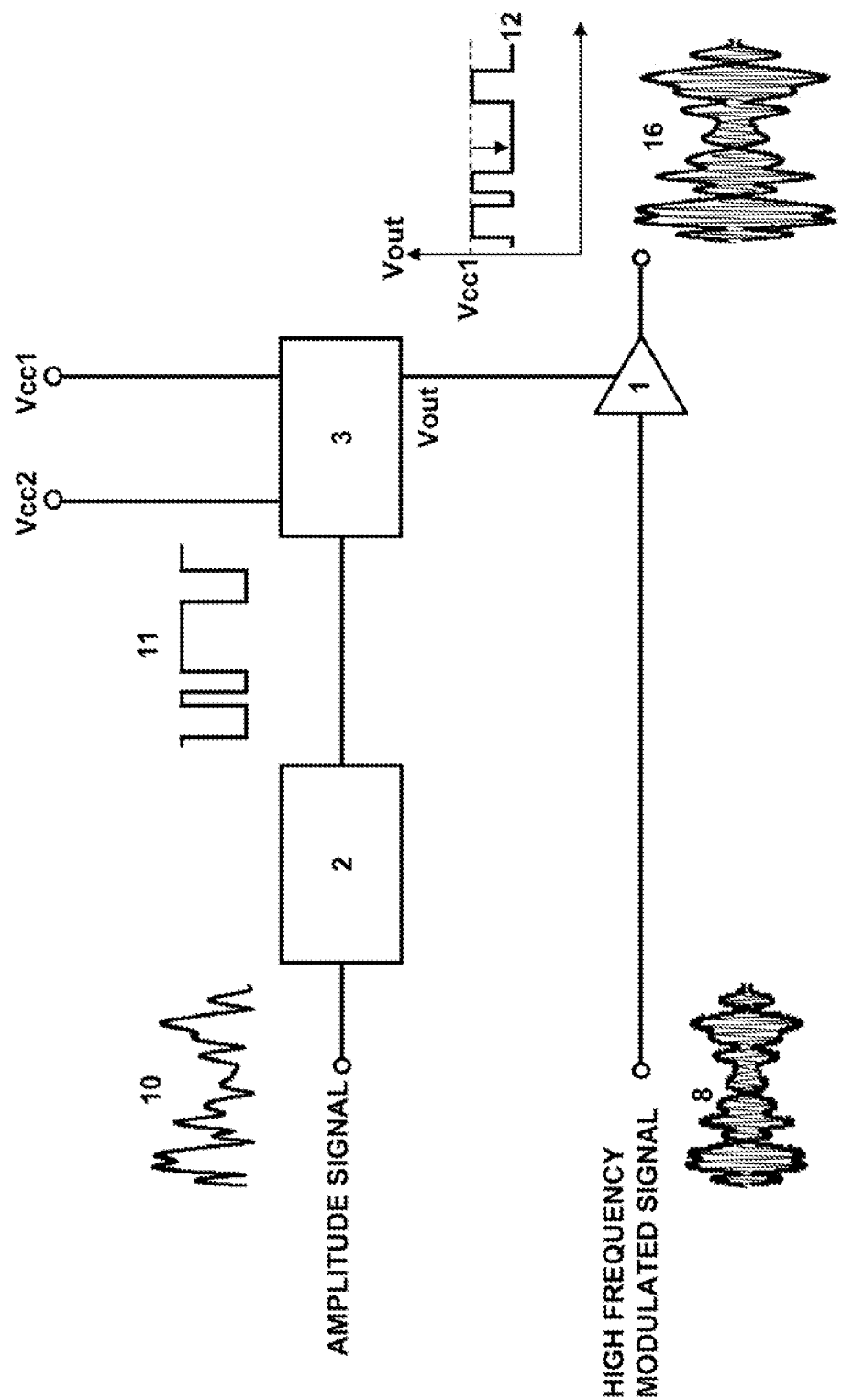
FIG. 1 is a diagram showing a configuration in a first exemplary embodiment of the present invention.

An amplification device according to the present invention is provided with an amplifier (1 in FIG. 1) that linearly amplifies an input modulated signal, a control signal generator (2) that receives an amplitude signal of the input modulated signal and generates a control signal (11), and a power combiner (3) that supplies, to an amplifier, a difference power obtained by using a second power supply to amplify the control signal from the control signal generator (2) and transferring the amplified power in one direction toward a first power supply.

In the control signal generator (2), a judgment is made as to whether the amplitude component of the input modulated signal is larger or smaller than a reference signal, and when smaller, outputs a binary control signal (11) of a first value, and when larger, outputs a binary control signal (11) of a second value. In the power combiner (3), by performing ON/OFF control of a switching amplifier driven by a second power supply (Vcc2) using the control signal (11), when the amplitude is smaller than for a reference signal, power is amplified in a pulse shape.

In the power combiner (3), a transformer or the like is used to transfer the amplified power in the first power supply direction.

The obtained difference power is obtained by subtracting power supplied in excess when the amplitude is smaller than for the reference signal, from the power supplied by the first power supply (Vcc1). This difference power is supplied as a power supply to the amplifier (1) that linearly amplifies the input modulated signal.

As a result, the power supplied in accordance with the size of the amplitude changes in a pulse shape, and unnecessarily large power is not supplied when the amplitude is small.

As a result, power efficiency of the amplification device is improved.

Furthermore, since unnecessary power is directly subtracted from the first power supply, it is not necessary to provide newly a voltage conversion circuit for generating average power, as in a conventional method and there is no power loss corresponding to the voltage conversion circuit. Therefore, it is possible to realize high power efficiency.

In the amplification device according to the present invention, the control signal generator (2) outputs a binary control signal, obtained by performing pulse modulation of a signal for which a change of amplitude intensity of an input modulated signal is inverted. For example, in a case where a pulse modulation method is PWM (Pulse Width Modulation), a control signal is output for which the pulse width of a High pulse is narrow where the amplitude intensity of the input modulated signal is large, and for which the pulse width of a High pulse is wide where the amplitude intensity is small.

Alternatively, in a case where the pulse modulation method is PDM (Pulse Density Modulation), a control signal is output for which a High pulse density is coarse where the amplitude of the input modulated signal increases, and, in which a High pulse density is dense where the amplitude decreases. Using the control signal obtained in this way, by performing ON/OFF control of a switching amplifier which is driven by the second power supply in the power combiner (3), switching amplification is performed on pulse power subjected to modulation of inverting amplitude intensity.

In addition, using a transformer or the like, amplified power is transferred in the direction of the first power supply. A difference power obtained by subtracting a current by smoothing a current generated by this transfer with a filter from a current supplied by the first power supply, is that obtained by subtracting power supplied in excess when the amplitude is small, from the first power supply. By providing this as a power supply of the amplifier (1) that linearly amplifies the input modulated signal, power supplied in accordance with the size of amplitude is chanted. Unnecessarily large power is not supplied when the amplitude is small and hence power efficiency of the power amplification apparatus is improved.

Unnecessary power is subtracted directly from the first power supply, and a new voltage conversion circuit for generating average power as in conventional methods is not necessary. As a result, there is no power loss corresponding to the voltage conversion circuit and it is possible to realize high power efficiency.

Alternatively, in the amplification device according to the present invention, the control signal generator (2) outputs a High/Low control signal, obtained by performing pulse modulation of a signal for which change of amplitude intensity of the input modulated signal is inverted. For example, in a case where the pulse modulation method is PWM, a control signal is output for which a High pulse width is narrow where the amplitude intensity of the input modulated signal is large, and for which a High pulse width is large where the amplitude intensity is small.

Alternatively, in a case where the pulse modulation method is PDM, a control signal is output for which a High pulse density is coarse where the amplitude of the input modulated signal increases, and for which a High pulse density is dense where the amplitude decreases.

Using the control signal obtained in this way, by performing ON/OFF control of a switching amplifier driven by the second power supply in the power combiner (3), switching amplification is performed on pulse power subjected to modulation of inverting amplitude intensity. In addition, using a transformer or the like, amplified power is transferred in the direction of the first power supply.

A difference power obtained by subtracting a current obtained by smoothing a current generated in this transfer by a filter from a current supplied by the first power supply is equal to a power obtained by subtracting a power, which is supplied in excess when the amplitude is small, from the first power supply, accurately along an amplitude waveform. By supplying the difference power as a power supply of the amplifier that amplifies the phase component of the input modulated signal at high efficiency in an output saturation region, the amplitude component and the phase component of the input modulated signal are combined and amplified.

By having this type of procedure, since only power equivalent to the amplitude waveform amount is supplied from the power supply, and also the amplifier always operates in a high efficiency saturation region, the power efficiency of the power amplification apparatus is improved.

Since unnecessary power direct from the first power supply is subtracted, a new voltage conversion circuit for generating an average power as in a conventional method is not necessary. There is no power loss corresponding to the voltage conversion circuit and it is possible to realize high power efficiency.

According to the present invention, it is possible to amplify with high efficiency an input signal whose amplitude and phase have been modulated.

A reason for this is that, in the amplification device according to the present invention, by changing the size of power supplied in accordance with change of amplitude of the input modulated signal, excess power is not supplied when amplitude is small, and only the minimum necessary power is constantly supplied to the amplifier.

Another effect of the present invention is that it is possible to realize a modulated power supply with efficiency higher than a conventional case, with fewer parts than in a conventional case.

A reason for this is that, in a conventional method, a DC-DC converter or the like is used to perform stepping down from a primary power supply to approximately average power, necessary peak power is added thereto when the amplitude of the input modulated signal is large, and a supply is provided to the amplifier. Therefore, in the conventional method, the DC-DC converter is required in order to generate the average power. As a result, not only does the number of parts increase, but loss of the DC-DC converter cancels out an efficiency improvement effect in the amplifier due to power supply modulation and hence a sufficient efficiency improvement effect could not be expected for an entire amplification device system.

In contrast to this, the amplification device according to the present invention is adapted to sample power which is supplied in excess when the amplitude is small, and to directly return the excess power to the primary power supply, so that it suffices to generate the minimum necessary power supplied to the amplifier. Therefore, the DC-DC converter for generating the average power is not necessary, and not only is an increase in parts and cost suppressed, but by a loss amount of the DC-DC converter, it is possible to anticipate higher efficiency than with a conventional method. A detailed description is provided below according to several specific exemplary embodiments.

First Exemplary Embodiment

FIG. 1 is a diagram for describing a first exemplary embodiment of the present invention. Referring to FIG. 1, a detailed description is provided of the first exemplary embodiment.

In FIG. 1, there is illustrated a diagram of an overall configuration of a high frequency amplification device according to the first exemplary embodiment of the present invention. Referring to FIG. 1, the high frequency amplification device according to the first exemplary embodiment of the present invention includes a high frequency amplifier 1, a control signal generator 2, and a power combiner 3. An amplitude component 10 of an input modulated signal is received by the control signal generator 2. The control signal generator 2 generates a control signal (pulse signal) 11 which is High where the amplitude is less than or equal to a fixed value, and is Low where the amplitude is greater than or equal to a fixed value.

Using the control signal (pulse signal) 11, the power combiner 3 controls conduction/non-conduction of a current from a second power supply Vcc2, and power at a time of conduction is transferred in one direction toward a first power supply Vcc1.

A difference power 12 obtained as a result thereof is supplied to the amplifier 1.

A high frequency input signal 8 which has been both amplitude modulated and phase modulated is received by the amplifier 1.

The amplifier 1, with a modulated voltage (Vout) (difference voltage) 12 from the power combiner 3 as a power supply, performs class A or AB linear amplification, or the like, and outputs a high frequency modulated signal 16 subjected to amplitude and phase modulation.

Figure 2:
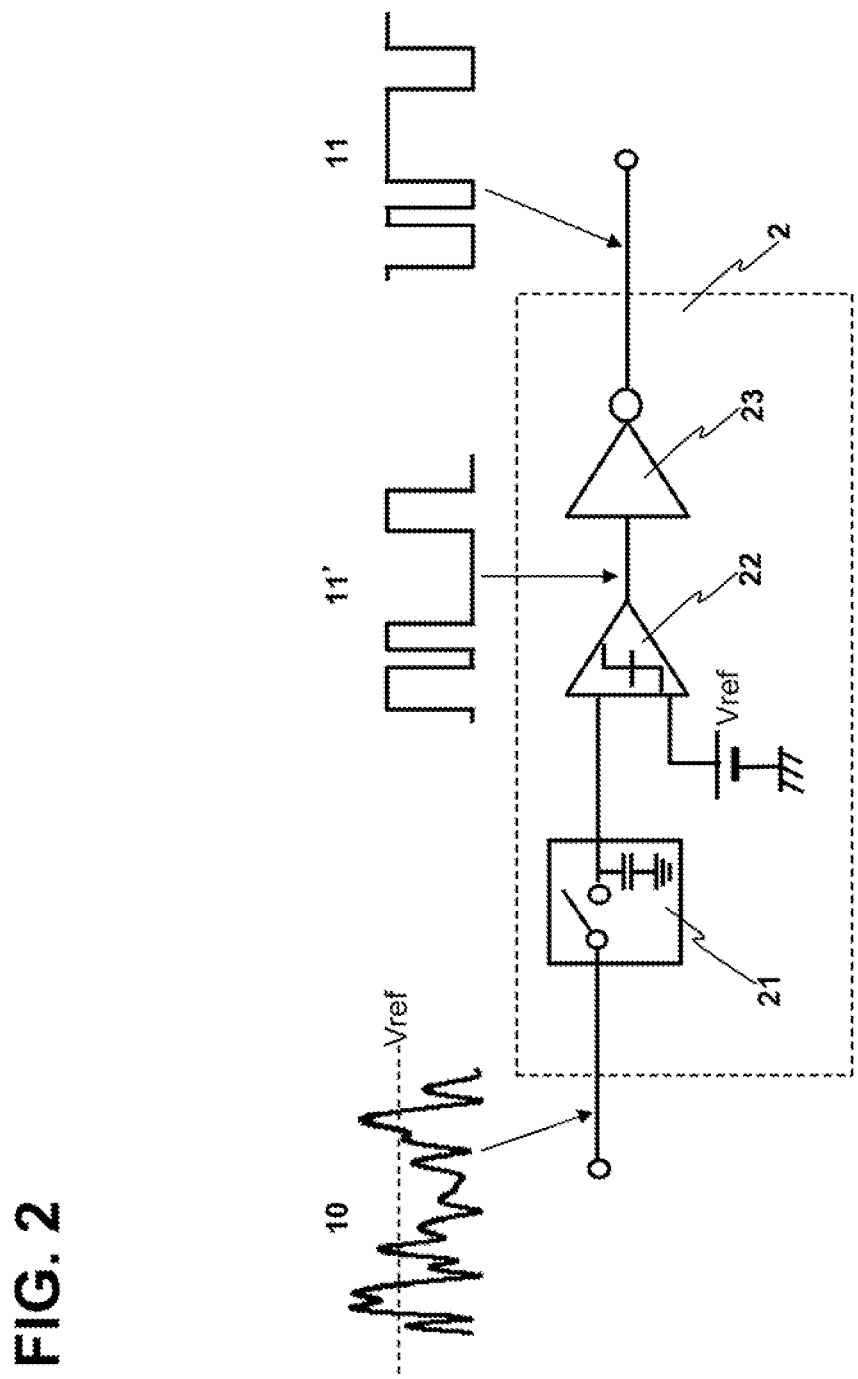
FIG. 2 is a diagram showing a configuration example of a control signal generator in the first exemplary embodiment of the present invention.

FIG. 2 shows a more specific example of the configuration of the control signal generator 2 of FIG. 1. The control signal generator 2 includes a sample and hold circuit 21, a comparator 22, and an inverter 23. The sample and hold circuit 21 connects an input signal to a capacitor when a switch is ON, and outputs and holds the level of the input signal held in a capacitor when the switch is OFF. The comparator (voltage comparator) 22 compares an output of the sample and hold circuit 21 with a reference voltage Vref to output a binary signal. The input signal is connected to the capacitor when the switch is ON, and the level of the input signal held in the capacitor is output and held when the switch is OFF. The inverter 23 inverts an output of the comparator (voltage comparator) 22.

Figure 3:
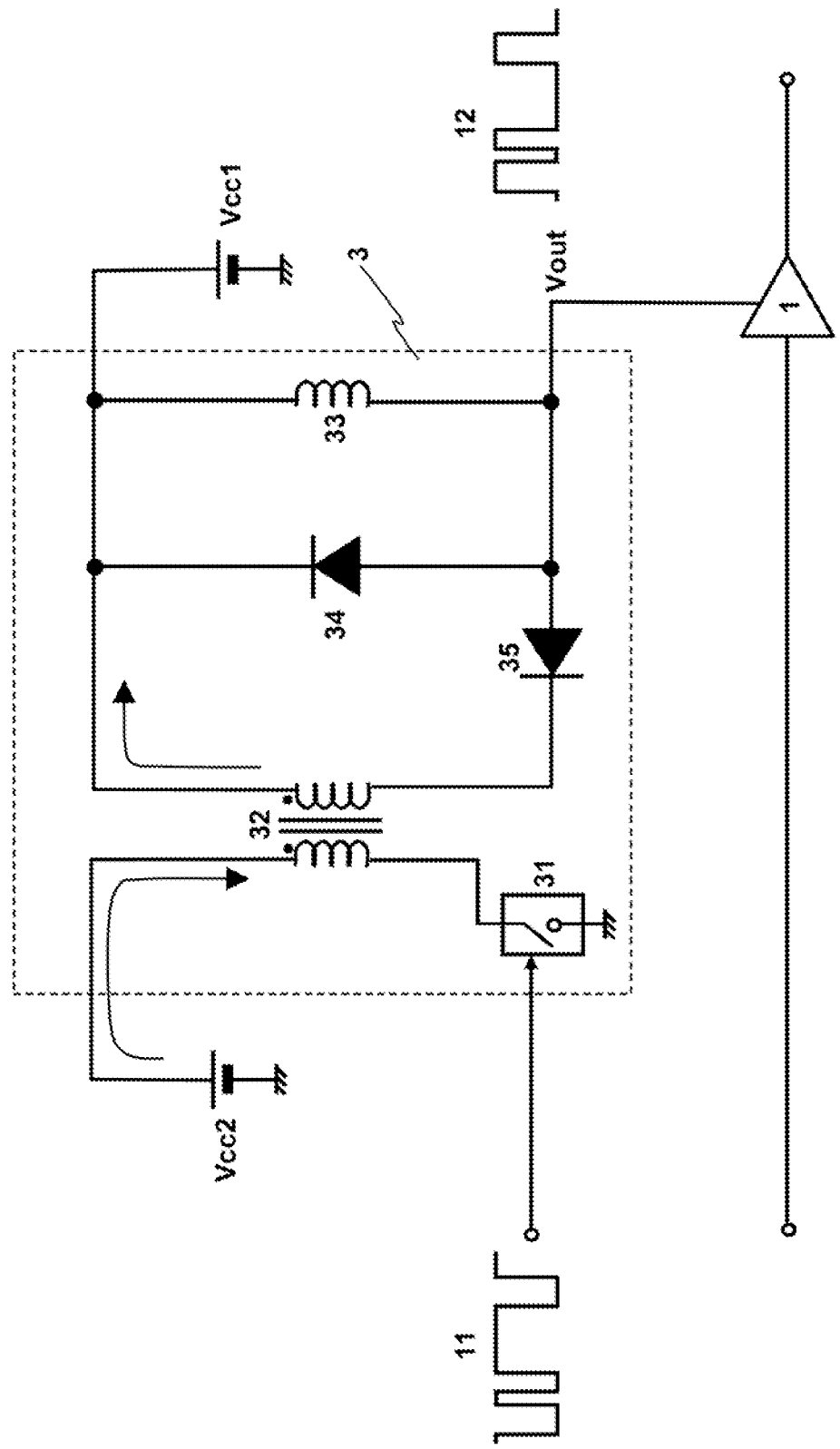
FIG. 3 is a diagram showing a configuration example of a power combiner in the first exemplary embodiment of the present invention.

FIG. 3 is a diagram showing a more specific configuration example of the power combiner 3 of FIG. 1. Referring to FIG. 3, the power combiner 3 includes a switching element 31, a transformer 32, a choke inductor 33, and diode elements 34 and 35. The switching element 31 receives the control signal 11 at a control terminal and is controlled to be turned ON and OFF. The transformer 32 has one end of a primary winding thereof connected to a second power supply Vcc2 (Vcc2<Vcc1), and the other end of the primary winding thereof connected to ground via the switching element 31. The transformer 32 has one end of a secondary winding thereof connected to the first power supply Vcc1, and the other end of the secondary winding thereof connected to a cathode of the diode element 35. Between a connection node of the end of the secondary winding and the first power supply Vcc1, and an anode of the diode element 35, the choke inductor 33 and the diode element 35 are connected in parallel. A connection node of anodes of the diode elements 34 and 35 and the choke inductor 33 is connected to a power supply terminal of the amplifier 1, as an output terminal of the power combiner 3.

FIGS. 4A-4D are examples of flow of signals for describing operation of each block of FIG. 1. Next a detailed description is provided concerning operation of a first mode of the present invention, with reference to FIG. 1 to FIGS. 4A-4D.

As shown in FIG. 1, the amplitude component 10 of the input modulated signal is received by the control signal generator 2. In the control signal generator 2 shown in FIG. 2, the sample and hold circuit 21 performs sampling of an amplitude signal 10.

Figure 4A:
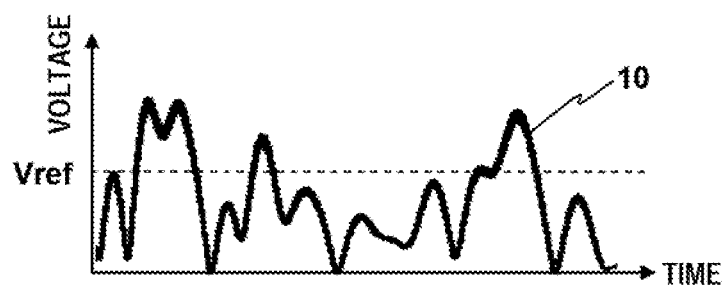
FIGS. 4A to 4D are diagrams showing an operation waveform in the first exemplary embodiment of the present invention.

The comparator 22 decides whether or not the sampled amplitude signal is larger than the reference signal Vref, as High or Low (refer to FIG. 4A).

Figure 4B:

The inverter 23 inverts an output signal 11' of the comparator 22 (refer to FIG. 4B).

Figure 4C:
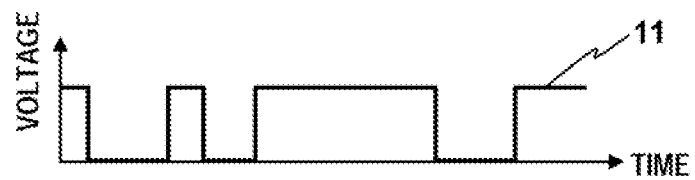
Figure 4D:
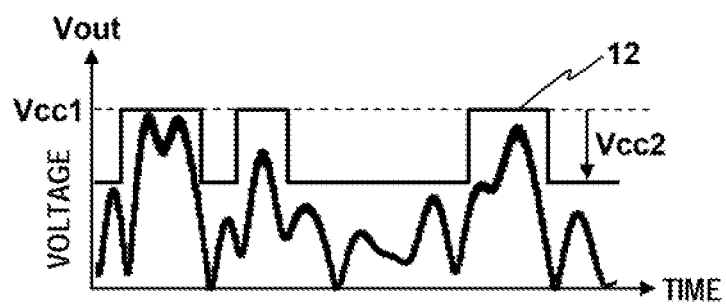

By performing this type of processing, the control signal 11 which is High when the amplitude is less than or equal to a fixed value (Vref), and is Low when the amplitude is greater than or equal to a constant value (refer to FIG. 4C).

In the power combiner 3 shown in FIG. 3, by using the control signal 11 from the control signal generator 2 and perform ON/OFF control of the switching element 31 formed by, for example, a MOS field effect transistor (MOSFET: Metal Oxide Semiconductor Field Effect Transistor) or the like, conduction/non-conduction of a current from the second power supply Vcc2 is controlled. The second power supply Vcc2 and the first power supply Vcc1 are coupled using the transformer 32.

At this time, as shown by an arrow in FIG. 3, when the switching element 31 is ON, by a current that flows from the second power supply Vcc2, a polarity of the transformer 32 is chosen so that energy accumulated on a primary side of the transformer 32 is transferred in an output terminal direction of the first power supply Vcc1, on a secondary side of the transformer 32.

A current generated on the secondary side of the transformer 32 passes through the diode element 35 and flows in a direction of the first power supply Vcc1.

The current flowing in the diode element 35 is a current branched from the current supplied constantly to the amplifier 1 via the choke inductor 33 from the first power supply Vcc1. As a result, since the current flowing to the amplifier 1 decreases by an amount of the branched current, the potential of the output Vout of the power combiner 3 decreases.

Next, when the switching element 31 is OFF, so that current flows in the opposite direction to the arrow of FIG. 3 on the secondary side of the transformer 32, the potential of the output Vout begins to rise.

When the potential of output Vout reaches the first power supply voltage Vcc1, the diode element 34 is made conductive, the output Vout does not become higher than the first power supply voltage Vcc1. The current flowing in the diode element 34 flows in the first power supply Vcc1 direction.

By repeating these operations, the output voltage Vout, if the turns ratio of the primary side and the secondary side of the transformer 32 is 1 to 1, the first power supply voltage Vcc1 is constantly applied to the amplifier 1. When the switching element 31 is ON, a voltage waveform (difference voltage) 12 of a rectangular shape obtained by subtracting the second power supply voltage Vcc2 from the first power supply voltage Vcc1 (refer to FIG. 4D) is applied to the amplifier 1.

In the present exemplary embodiment, in order to generated a modulated voltage (difference voltage) 12 supplied to the amplifier 1, the voltage amount of the second power supply voltage Vcc2 is subtracted directly from the first power supply voltage Vcc1, when the amplitude of the input signal 10 is small. As a result, A DC-DC converter that generates an average power becomes unnecessary, and in comparison to a conventional example described with reference to FIG. 15, it is possible to realize a high efficiency, by a power loss amount of the DC-DC converter.

It is to be noted that in the present exemplary embodiment, operation of the control signal generator 2 is realized by an analog circuit, but the same function may be realized digitally in a baseband unit. If the same function is present, the configuration is not limited to this.

The turns ratio of the transformer 32 can be chosen arbitrarily for ease of design in accordance with the system.

In the power combiner 3 of FIG. 3, as normally adopted in an insulating type DC-DC converter, a snubber circuit for alleviating overvoltage at a time of a voltage rising or falling, or a power regeneration circuit for recovering an excitation current for the power supply Vcc2 may be added.

In the power combiner 3 of FIG. 3, the diode 35 is not always necessarily, and even without this, a similar operation may be performed. However, in case the diode 35 is not present, when the switching element 31 is OFF and a current in a direction opposite to the arrow of FIG. 3 flows on a secondary side of the transformer 32, a strong overvoltage is produced on the primary side of the transformer 32, and there is a possibility of destroying the switching element 31. Therefore, the diode 35 is preferably provided. It is to be noted that the diode 35 may be provided at a position in FIG. 5.

Figure 5:
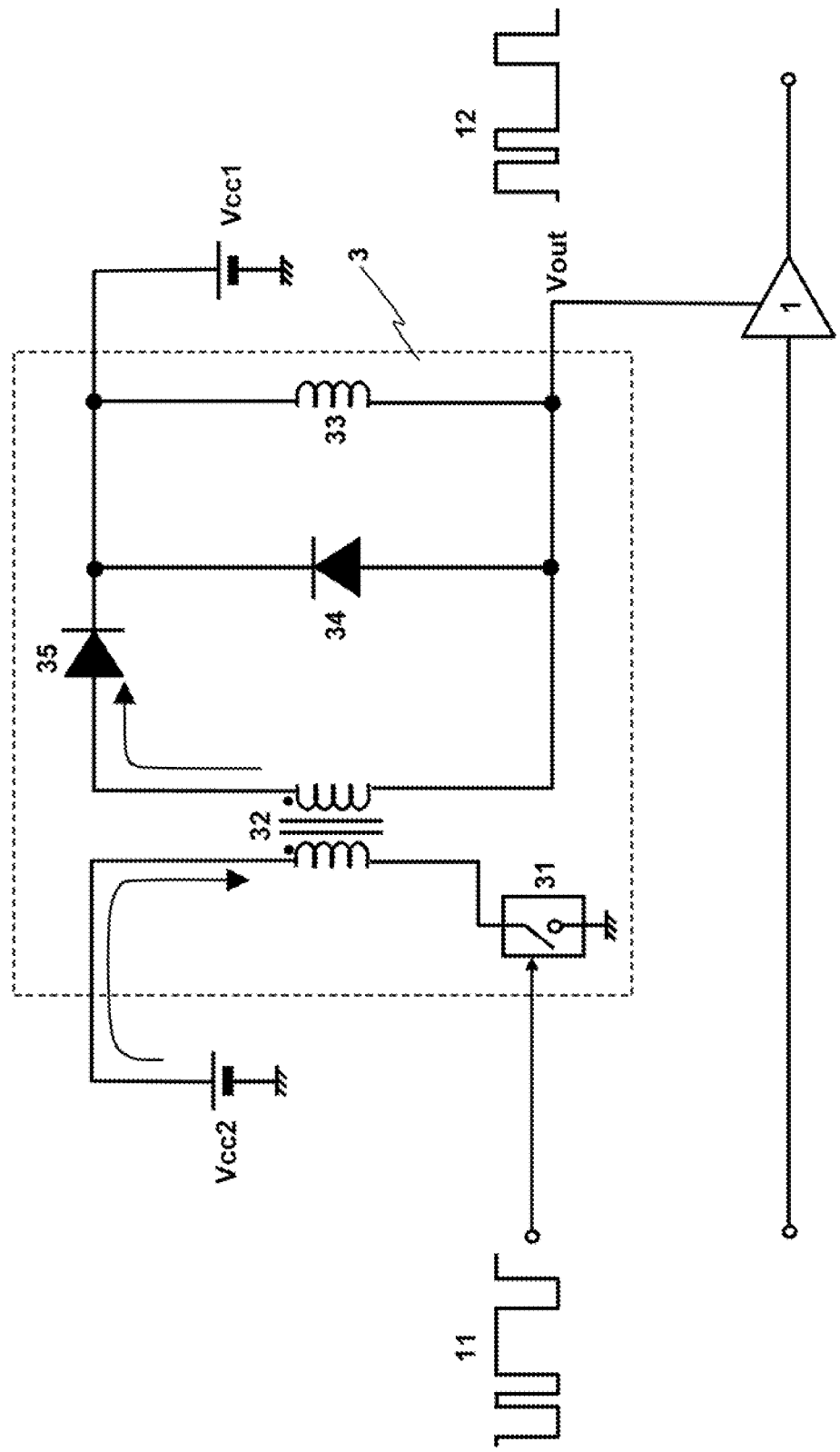
FIG. 5 is a diagram showing another configuration example of the power combiner in the first exemplary embodiment of the present invention.

The diode elements 34 and 35 of FIG. 3 and FIG. 5 may be switching elements composed by an FET or the like in synchronization with the control signal 11. In this case, by providing at a position in the diode element 35 a switching element (same phase as the switching element 31) that is ON when the control signal 11 is High and is OFF when the control signal 11 is Low, and providing at a position on the diode element 34 a switching element (reverse phase to the switching element 31) that is OFF when the control signal 11 is High and is ON when the control signal 11 is Low, it is possible to realize operation the same as above.

Using the switching element, it is possible to have a voltage higher than the diode by a step down amount of a forward voltage of the diode at which a diode current begins to flow.

Second Exemplary Embodiment

Figure 6:
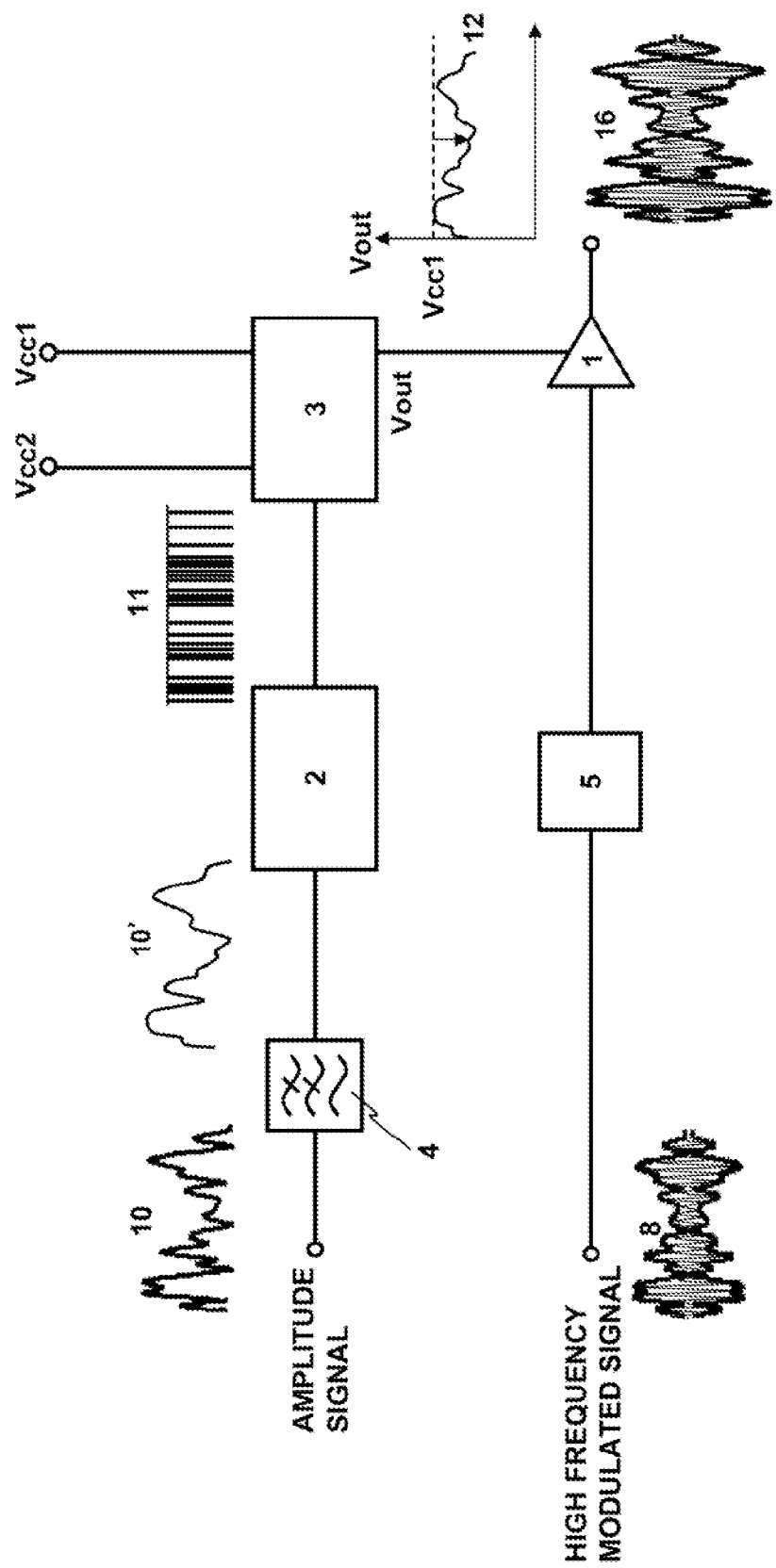
FIG. 6 is a diagram showing a configuration in a second exemplary embodiment of the present invention.

A second exemplary embodiment of the present invention will be described in detail with reference to the diagrams. FIG. 6 is a block diagram showing an overall configuration of a high frequency amplification device according to the second exemplary embodiment of the present invention. Referring to FIG. 6, a high frequency amplifier 1, a control signal generator 2, a power combiner 3, a low pass filter 4, and a delay device are provided. A signal 10' obtained by band-limiting an amplitude component 10 of an input modulated signal by the low pass filter 4 is received by the control signal generator 2.

The control signal generator 2 converts the band-limited signal 10' to a pulse modulated signal (control signal) 11. The polarity of the pulse modulated signal is made reversed as compared with a normal case. That is, in a case of pulse density modulation such as delta modulation or sigma-delta modulation, modulation is performed such that pulse density is made coarse where the amplitude increases, and pulse density is made dense where the amplitude decreases.

In a case of pulse width modulation, modulation is performed such that pulse width is made narrow where the amplitude is large, and pulse width is made wide where the amplitude is small.

Using the pulse modulated signal (control signal) 11 obtained in this way, conduction/non-conduction of current from the second power supply Vcc2 is controlled in the power combiner 3.

The power, when being conducted, is smoothed by a filter (for example, an inductor 36 and a capacitor 37 in FIG. 8) and is transferred in one direction to the first power supply Vcc1.

A difference power (difference voltage) 12 obtained in this way is supplied to the amplifier 1.

The amplifier 1, which is supplied with a modulated voltage (Vout) (difference voltage) 12 from the power combiner 3 as a power supply, performs class A or AB linear amplification, or the like, and outputs a high frequency modulated signal 16 which has amplitude and phase modulated.

Figure 7:
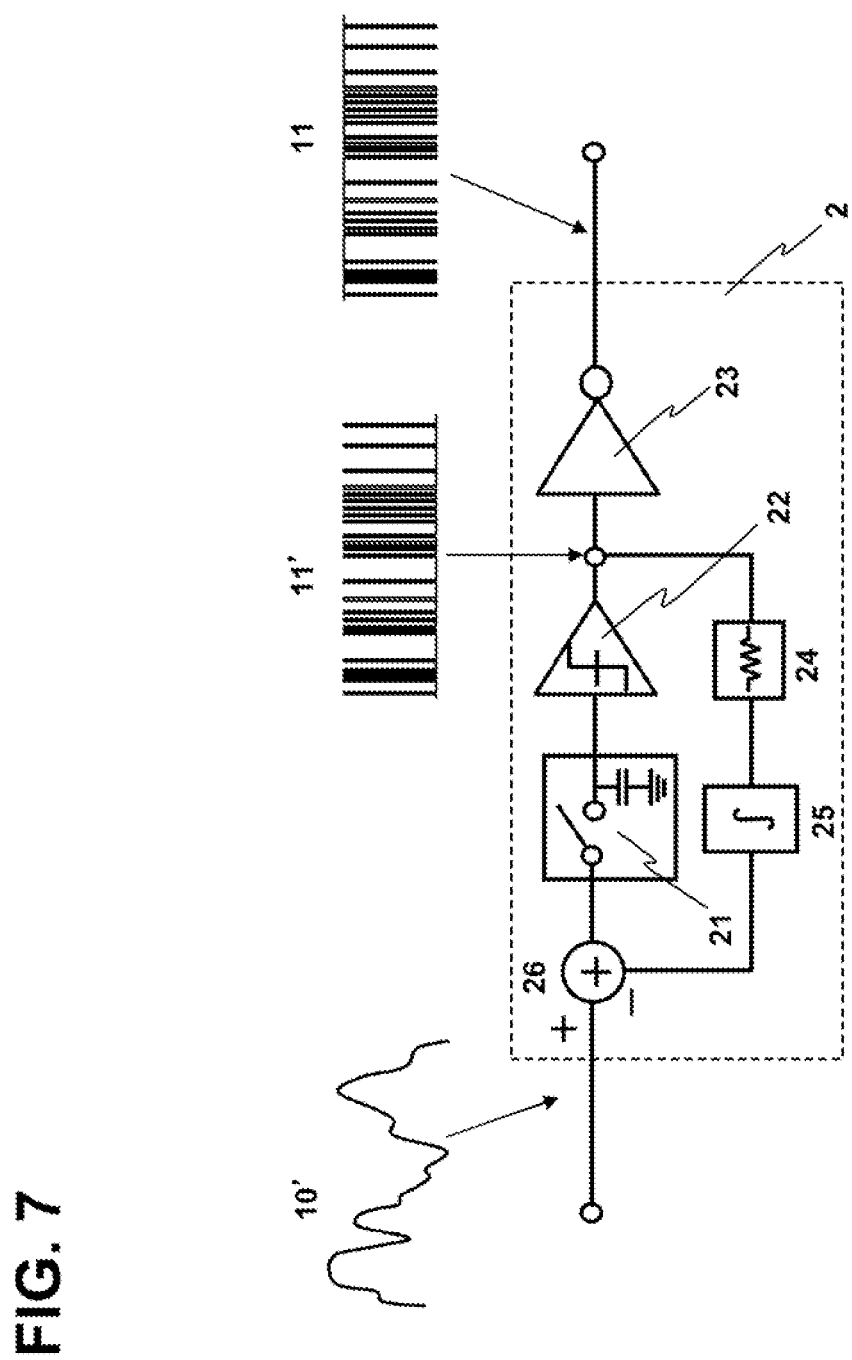
FIG. 7 is a diagram showing a configuration example of a control signal generator in the second exemplary embodiment of the present invention.

FIG. 7 shows a configuration of a delta modulator as a more specific configuration example of the control signal generator 2 of FIG. 6. Referring to FIG. 7, there are provided a subtractor 26 that receives the band-limited signal 10', a sample and hold circuit 21 that receives an output of the subtractor 26, a comparator 22 that receives an output of the sample and hold circuit 21, an inverter 23 that inverts and outputs an output of the comparator 22, an attenuator 24 that receives an output of the comparator 22, and an integrator 25 that integrates an output of the attenuator 24 and has an output connected to an input of the subtractor 26. The subtractor 26 supplies to the sample and hold circuit 21 a value obtained by subtracting an output of the integrator 25 from the band-limited signal 10'.

Figure 8:
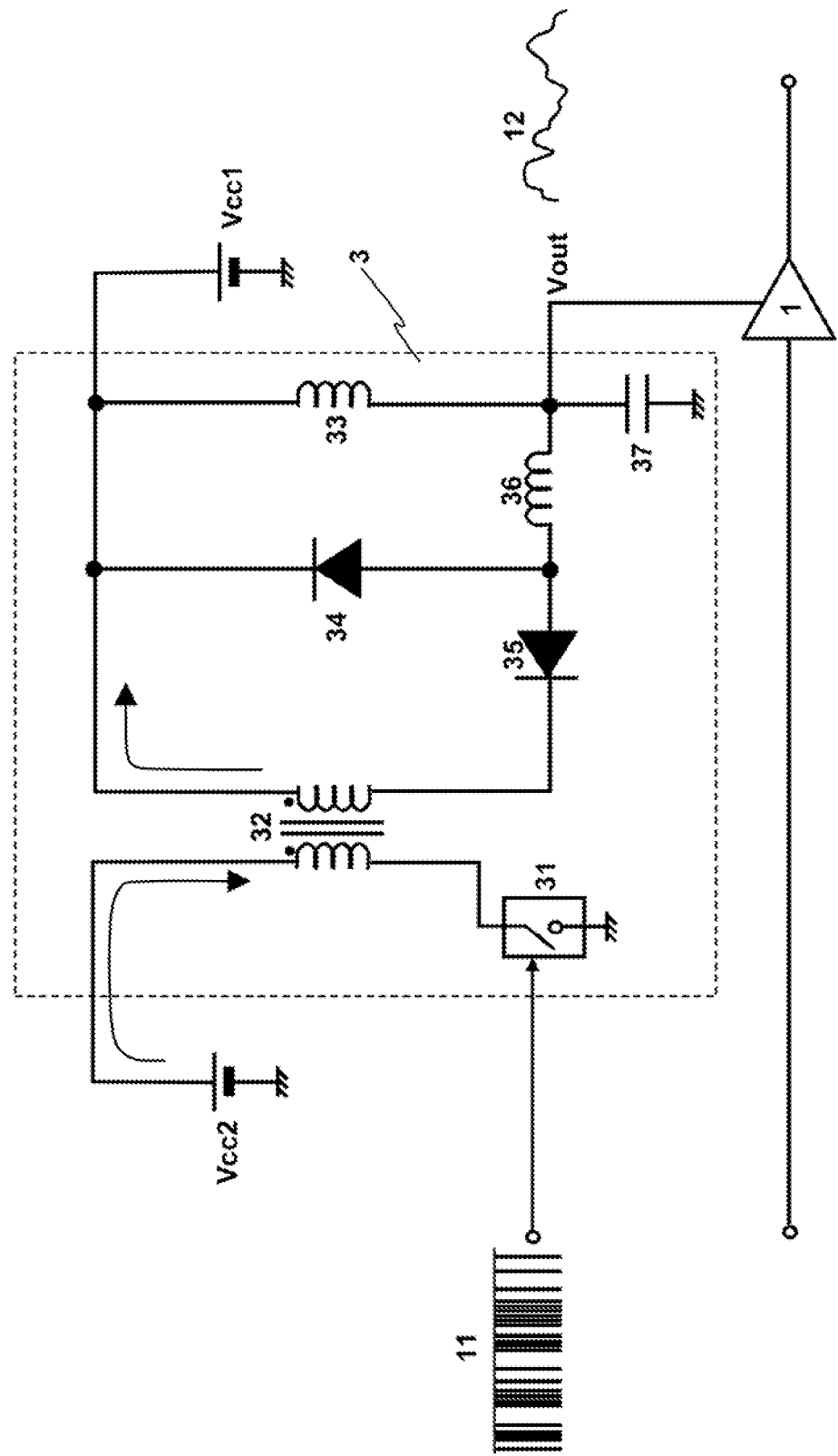
FIG. 8 is a diagram showing a specific configuration example of a power combiner in the second exemplary embodiment of the present invention.

FIG. 8 is a diagram showing a more specific configuration example of the power (combiner 3 of FIG. 6. The power combiner 3 includes a switching element 31, a transformer 32, a choke inductor 33, diode elements 34 and 35, a filter inductor 36, and a filter capacitor 37 are provided. The filter capacitor 37 connected between output Vout and GND, and the filter inductor 36 connected between the output Vout and an anode of the diode 35 are added to the configuration of FIG. 5.

FIGS. 9A-9F are examples of flow of a signal for describing operation of each block of FIG. 6. Next, a detailed description is provided concerning operation of the second exemplary embodiment of the present invention, making reference to FIG. 6 to FIGS. 9A-9F.

Figure 9A:
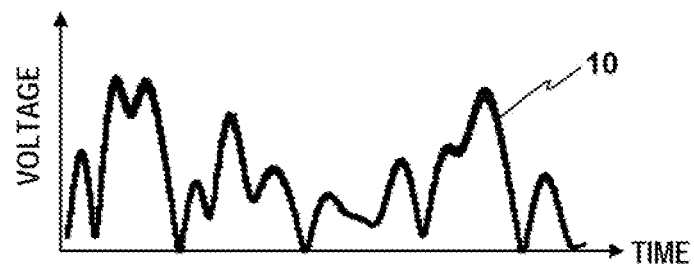
FIGS. 9A to 9F are diagrams showing an operation waveform in the second exemplary embodiment of the present invention.
Figure 9B:

As shown in FIG. 6, the amplitude component 10 of the input modulated signal is received by the low pass filter 4 and is band-limited (FIGS. 9A and 9B).

The band-limited amplitude signal 10' is received by the control signal generator 2.

In the delta modulation type control signal generator 2 shown in FIG. 7, the band-limited amplitude signal 10' is provided to the subtractor 26. The subtractor 26 obtains the difference between the band-limited amplitude signal 10' and a reference signal, and gives the result to the sample and hold circuit 21.

Figure 9C:
Figure 9D:
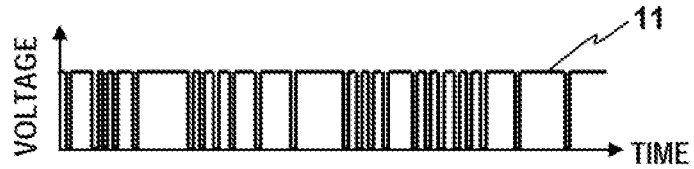

The sample and hold circuit 21 performs sampling of a signal from the subtractor 26. The comparator 22, by comparing the value of a sampled input signal and a threshold, determines a magnitude relationship of the input and the reference signal, and outputs a pulse modulated signal (control signal) 11', which is High when the input signal is larger than the reference signal, and is Low when the input signal is smaller than the reference signal (FIG. 9C).

A part of output of the comparator 22 is supplied to the inverter 23, and the remainder is supplied to the attenuator 24. The attenuator 24 attenuates an output of the comparator 22 to a suitable level and supplies the attenuated signal to the integrator 25.

The integrator 25 integrates a signal from the attenuator 24 and generates a reference signal to be supplied to the subtractor 26. The integrator 25 is configured, for example, by a first-order RC low pass filter. The inverter 23 inverts a polarity of the output signal 11' of the comparator 22 (refer to FIG. 9D).

By operation of each part of the control signal generator 2 described above, in the output pulse modulated signal (control signal) 11 of the inverter 23, when there is a tendency for an input signal to increase, the Low ratio increases, and when there is a tendency for an input signal to decrease, the High ratio increases, so that with a delta modulated signal whose pulse density changes according to increase or decrease of the input signal, with a polarity reversed to that of a normal case.

In the power combiner 3 shown in FIG. 8, by using the control signal 11 to perform ON/OFF control of the switching element 31 configured by a MOSFET or the like, for example, conduction/non-conduction of a current from the second power supply Vcc2 is controlled.

The second power supply Vcc2 and the first power supply Vcc1 are coupled using the transformer 32. As shown by an arrow in FIG. 8, when the switching element 31 is ON, by a current that flows from the second power supply Vcc2, a polarity of the transformer 32 is chosen so that energy accumulated on a primary side of the transformer 32 is transferred in an output terminal direction of the first power supply Vcc1 on a secondary side of the transformer 32.

A current generated on the secondary side of the transformer 32 passes through the diode element 35 and flows in a direction of the first power supply. Vcc1. A part of the current supplied constantly to the amplifier 1 branches and flows, via the choke inductor 33 from the first power supply Vcc1 flows in the diode element 35.

Figure 9E:

The branched current gets a pulse modulation switching element frequency removed and smoothed by the low pass filter formed of the inductor 36 and the capacitor 37 (FIG. 9E).

By this type of operation, the current flowing to the amplifier 1 decreases by an amount of the branched current, the potential of the output voltage Vout also decreases. When the switching element 31 is turned OFF, on a secondary side of the transformer, current in a current is going to flow in an opposite direction and the potential of the output Vout begins to rise.

When the potential of the output Vout reaches the first power supply voltage Vcc1, the diode element 34 is ON, and the output voltage Vout does not become higher than the first power supply voltage Vcc1. The current flowing through the diode element 34 flows in the first power supply Vcc1 direction.

At this time, a current that passes through the low pass filter, formed from the inductor 36 and the capacitor 37 and gets smoothed, branches from the output terminal Vout.

Figure 9F:
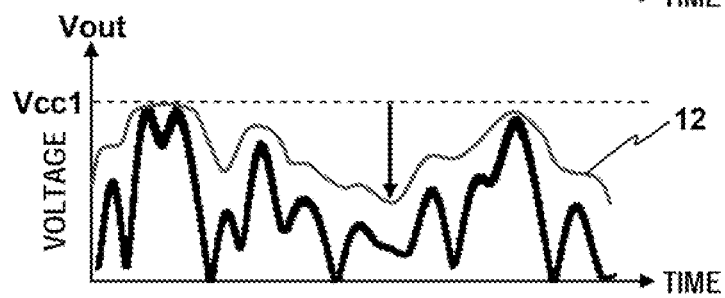

By repeating this operation, when the switching element 31 is ON, the output Vout takes a value obtained by subtracting a power which has been obtained by smoothing a pulsed power transferred to the secondary side of the transformer 32 from the first power supply voltage Vcc1 (FIG. 9F).

Figure 15:
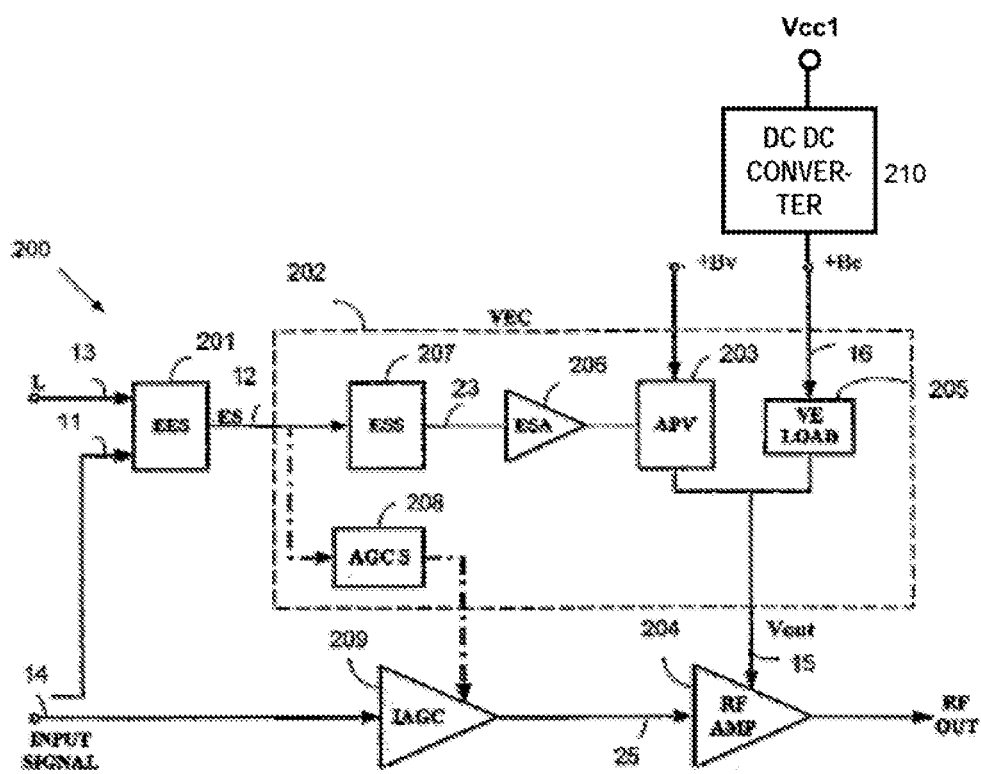
FIG. 15 is a diagram showing a configuration of a conventional power amplification apparatus having a voltage modulation function.
Figure 16A:
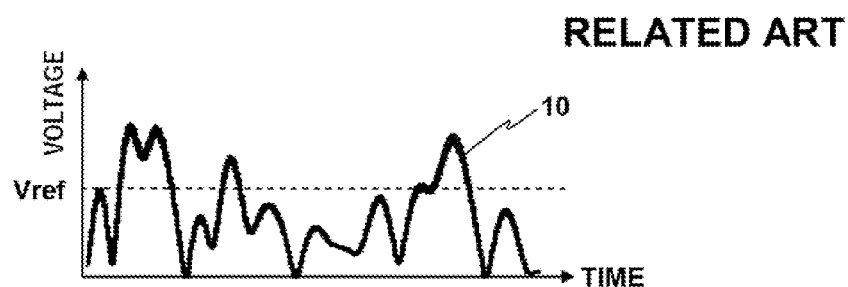
FIGS. 16A to 16C are diagrams showing an operation waveform of a conventional power amplification apparatus having a voltage modulation function.
Figure 16B:
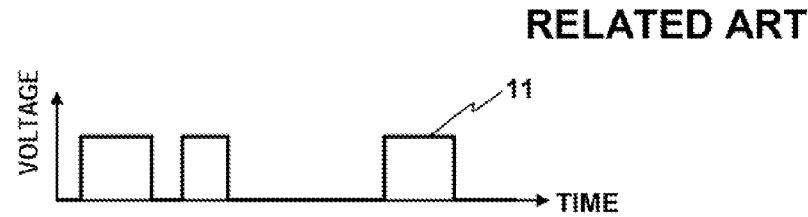
Figure 16C:
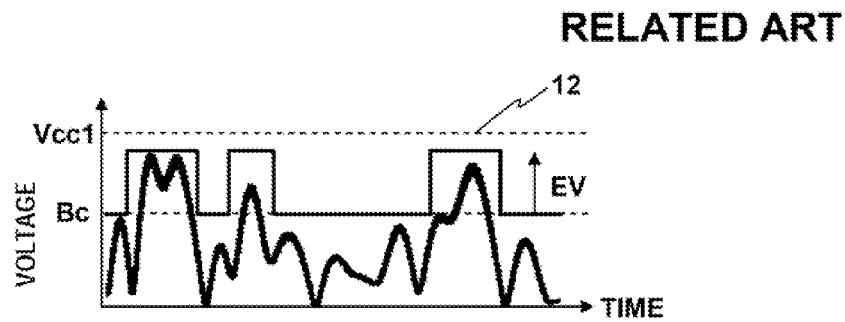

In the present exemplary embodiment, in order to finally generate a modulated voltage (difference voltage) 12 to be supplied to the amplifier 1, an extra voltage according to the amplitude of the amplitude signal 10 is directly subtracted from the power supply voltage Vcc1 and hence in comparison with a conventional example shown in FIG. 15, it is possible to realize a high efficiency by a power loss amount of a DC-DC converter.

It is to be noted that in the present exemplary embodiment, operation of the delta modulator of the control signal generator 2 is realized by an analog circuit, but the same function may be realized digitally within a baseband unit. Furthermore, if the same function is present, the configuration is not limited to this. A pulse modulation scheme in the control signal generator 2 may have a polarity reversed to the sigma-delta modulation or the pulse width modulation.

The turns ratio of the transformer 32 can be chosen arbitrarily for ease of design in accordance with the system.

In the power combiner 3 of FIG. 8, as normally adopted in an insulating type DC-DC converter, a snubber circuit for alleviating overvoltage at a time of a voltage rising or falling, or a power regeneration circuit for recovering an excitation current for the power supply Vcc2 may be added.

In the power combiner 3 of FIG. 8, the diode 35 is not always necessarily, and even without this, a similar operation may be performed. However, in this case, when the switching element 31 is OFF and a current in a direction opposite to the arrow of FIG. 8 flows on a secondary side of the transformer 32, and a strong overvoltage is produced on the primary side of the transformer. As a result, there is a possibility of destroying an SW element, and hence the diode element 35 is preferably provided. The diode element 35 may be provided at a position in FIG. 10. That is, an anode is connected to one end of the secondary winding, and a cathode is connected to the first power supply Vcc1.

Figure 10:
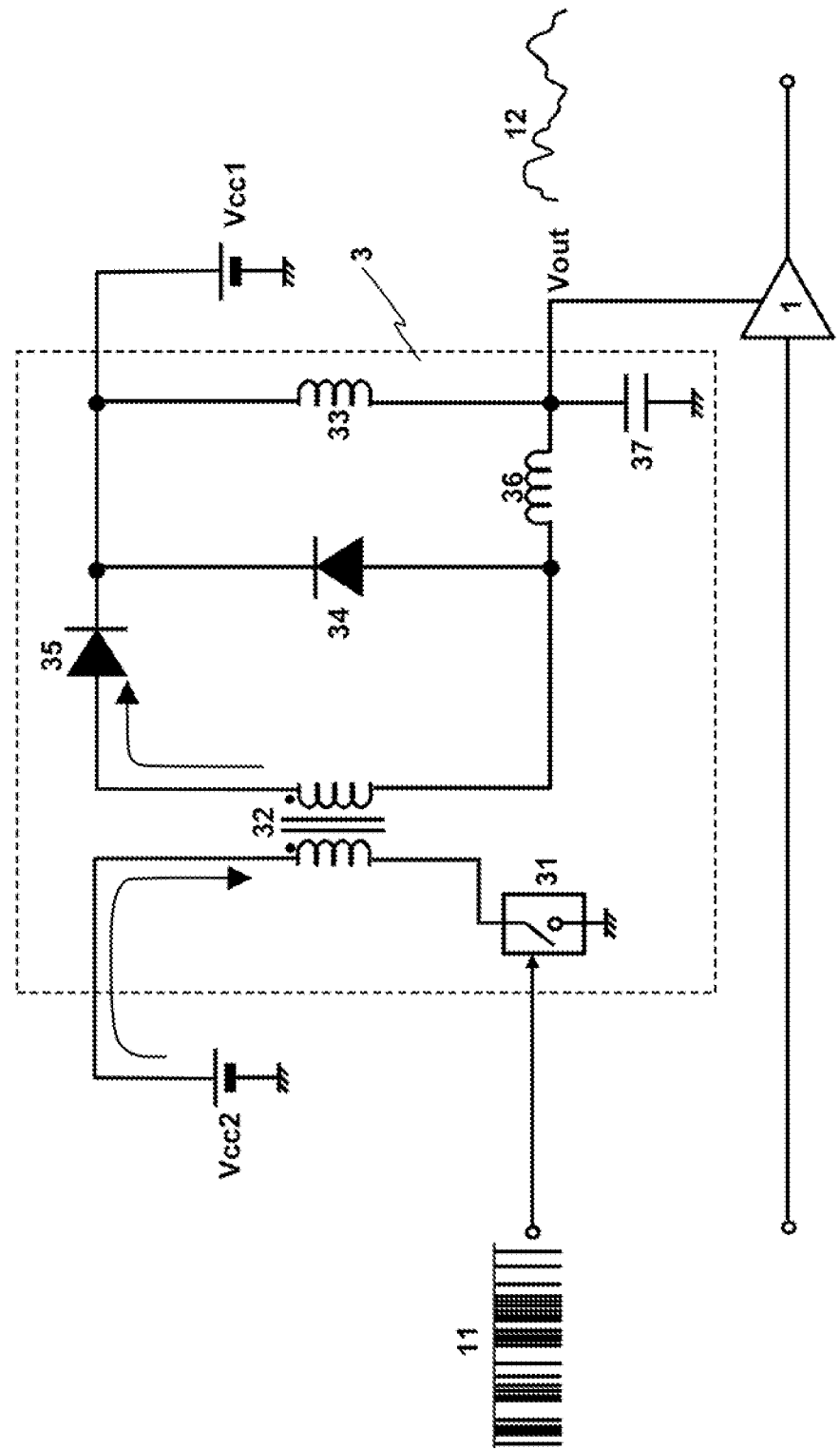
FIG. 10 is a diagram showing another configuration example of the power combiner in the second exemplary embodiment of the present invention.

The diode elements 34 and 35 of FIG. 8 and FIG. 10 may be switching elements each configured by an FET or the like, in synchronization with the control signal 11. In this case, by providing at a position in the diode element 35 a switching element (same phase as the switching element 31) that is ON when the control signal 11 is High and is OFF when the control signal 11 is Low, and providing at a position in the diode element 34 a switching element (reverse phase to the switching element 31) that is OFF when the control signal 11 is High and is ON when the control signal 11 is Low, it is possible to realize operation the same as above.

Using the switching element, it is possible to have a voltage higher than the diode, by a step down amount of a forward voltage at which a diode current begins to flow.

In the present exemplary embodiment, the low pass filter 4 is used in order to limit the frequency band of the input modulated signal and thereby alleviate performance demand of each circuit and element forming the control signal generator 2 and the power combiner 3 which are arranged on the succeeding stage of the low pass filter 4.

Instead of the low pass filter 4, there may be inserted at the same position another block which performs waveform shaping so that dynamic range and frequency band of the input modulated signal are decreased.

Conversely, in the present exemplary embodiment, in a case where each circuit forming the control signal generator 2, and the switching element 31 and the transformer 32 forming the power combiner 3 can operate sufficiently fast for the range of the amplitude component of the input modulated signal, the low pass filter 4 of FIG. 6 may be removed and the amplitude signal 10 may be supplied directly to the control signal generator 2. In this case, since in the amplifier 1 a modulated voltage closer to a waveform of the amplitude signal is supplied to the amplifier 1, it is possible to realize an even higher power efficiency.

Third Exemplary Embodiment

Next a third exemplary embodiment of the present invention, will be described with reference to the diagrams. FIG. 11 is a block diagram showing of an overall configuration of a high frequency amplification device according to the third exemplary embodiment of the present invention. The high frequency amplification device includes a high frequency amplifier 1, a control signal generator 2, a power combiner 3, and a limiter 6.

FIGS. 12A-12E are diagrams showing flow of signals for describing operation of each block of FIG. 11.

Figure 12A:
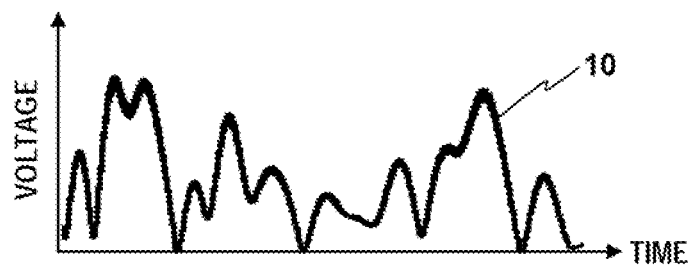
FIGS. 12A to 12E are diagram showing an operation waveform in the third exemplary embodiment of the present invention.
Figure 12B:
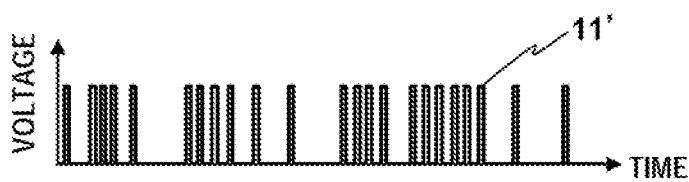

An amplitude component 10 of an input modulated signal is received by the control signal generator 2 (FIG. 12A).

Figure 12C:
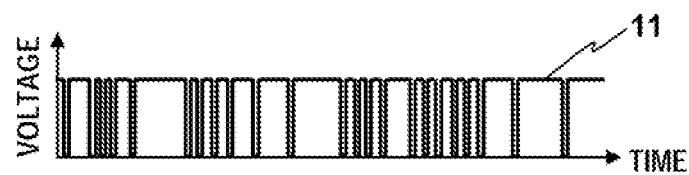

The control signal generator 2 converts the amplitude signal 10 to a pulse modulated signal (control signal) 11 (FIG. 12C).

At this time, the polarity of the pulse modulated signal is reversed to a normal case. That is, in a case of pulse density modulation such as delta modulation or sigma-delta modulation, modulation is performed such that pulse density is made coarse where the amplitude increases, and pulse density is made dense where the amplitude decreases.

In a case of pulse width modulation, modulation is performed such that pulse width is made narrow where the amplitude is large, and pulse width is made wide where the amplitude is small.

Using the pulse modulated signal (control signal) 11 obtained in this way, conduction/non-conduction of a current flowing from a second power supply Vcc2 is controlled by the power combiner 3.

Figure 12D:
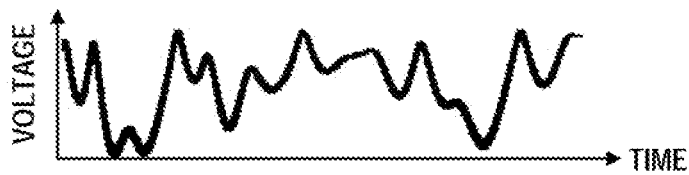
Figure 12E:
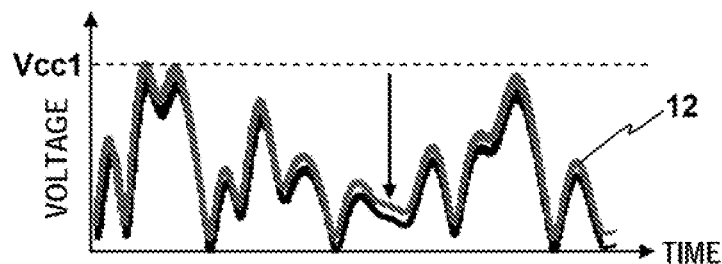

A power when conduction occurs is smoothed by a filter and is transferred in one direction toward a first power supply Vcc1 (FIG. 12D). The difference power 12 obtained in this way is supplied to the amplifier 1 (FIG. 12E).

In this case, if each element forming the control signal generator 2 and the power combiner 3 can be operated sufficiently fast, the difference power 12 accurately reproduces and amplifies a waveform of the amplitude component 10 of the input modulated signal.

A high frequency input signal 8 subjected to amplitude modulation and phase modulation is received by the limiter 6.

The limiter 6 makes constant the amplitude of the input modulated signal 8 and extracts a phase component 9. A phase signal 9 is received by the amplifier 1.

The amplifier 1 performs an amplification operation in an output saturation region in which class A or B efficiency takes the maximum value, or performs switching amplification as for class F or E, and always operates at high efficiency.

By operating in this way, the phase component 9 supplied to the amplifier 1 and the amplitude component 12 provided as a modulated power supply are multiplied, the amplitude and phase components are reproduced, and an output modulated signal 16 amplified at high efficiency is obtained.

In the present exemplary embodiment, a voltage 12 that is exceedingly close, to a waveform of the amplitude signal 10 is supplied to the amplifier 1 and hence it is possible to realize a further higher power efficiency.

The control signal generator 2 of FIG. 11 may use a delta modulation configuration shown in FIG. 7, and may use a sigma-delta modulation configuration or a pulse width modulation configuration.

The power combiner 3 of FIG. 11 can use a configuration shown in FIG. 8 or FIG. 10.

Fourth Exemplary Embodiment

FIG. 13 is a diagram showing a configuration in a fourth exemplary embodiment of the present invention. The present exemplary embodiment is a modification of the third exemplary embodiment shown in FIG. 11, and an amplitude component 10 is extracted, using an envelope detector 7, from a high frequency input signal 8 subjected to amplitude modulation and phase modulation. Operation of each of the other parts is as described for FIG. 11.

It is to be noted that a configuration in which the amplitude component 10 is extracted using the envelope detector 7 can also be applied to the first exemplary embodiment shown in FIG. 1, and to the second exemplary embodiment shown in FIG. 6.

Fifth Exemplary Embodiment

FIG. 14 is a diagram showing a configuration in a fifth exemplary embodiment of the present invention. In the present exemplary embodiment, an amplitude modulated and phase modulated signal is generated by a baseband circuit 13.

A phase signal is multiplied in a mixer 14 and a local signal generator 15 forming a carrier wave, to form a high frequency input signal 9 to which phase modulation has been applied. Operation of each of the other parts is as described for FIG. 11.

The power amplification apparatus according to the present invention is preferably used in a transmitter in wireless communication. For example, as an applied example of the present invention, a transmission device may be cited, which is used in a terminal or base station for a mobile telephone, wireless LAN or WiMAX, or a terrestrial digital broadcasting station.

It is to be noted that modifications and adjustments of embodiments and examples are possible within the bounds of the entire disclosure (including the scope of the claims) of the present invention, and also based on fundamental technological concepts thereof. Furthermore, a wide variety of combinations and selections of various disclosed elements are possible within the scope of the claims of the present invention. That is, the present invention clearly includes every type of transformation and modification that a person skilled in the art can realize according the entire disclosure including the scope of the claims and to technological concepts thereof.

What is claimed is:

1. A power amplification apparatus that amplifies an input signal including an amplitude component and a phase component, the device comprising:
   a control signal generator that generates a pulse modulated signal based on a signal obtained by inverting an intensity of an amplitude component of the input signal to output the pulse modulated signal as a control signal;
   a power combiner that performs switching amplification by controlling conduction and non-conduction of a current path from a second power supply, using the control signal, and transfers a pulsed power obtained by the switching amplification in one direction toward a first power supply to obtain a difference power for output; and a high frequency amplifier that amplifies the input signal to output an amplified signal, the high frequency amplifier being supplied with the difference power output from the power combiner, as a power supply.

2. The power amplification apparatus according to claim 1, wherein the high frequency amplifier, by amplifying a phase component of the input signal, under a power supply output from the power combiner, combines the phase component with an amplitude component of the input signal to output a resulting signal.

3. The power amplification apparatus according to claim 1, further comprising
a circuit that performs waveform shaping such that at least one of a frequency band and a dynamic range of an amplitude component of the input signal is decreased,
a signal subjected to the waveform shaping being received by the control signal generator.

4. The power amplification apparatus according to claim 3, wherein the circuit that performs waveform shaping such that at least one of a frequency band and a dynamic range of an amplitude component of the input signal is decreased, includes
a low pass filter.

5. The power amplification apparatus according to claim 2, further comprising
a limiter that makes an amplitude of the input signal constant and extracts the phase component.

6. The power amplification apparatus according to claim 1, further comprising
a delay unit that delays the input signal by a fixed amount,
an output of the delay device being supplied to the high frequency amplifier.

7. The power amplification apparatus according to claim 1, further comprising
an envelope detector that removes a carrier wave from the input signal and extracts the amplitude component.

8. The power amplification apparatus according to claim 1, wherein at least one of an amplitude component and a phase component of the input signal is supplied from a baseband unit arranged in a preceding stage of the power amplification apparatus.

9. The power amplification apparatus according to claim 8, further comprising
a mixer that combines a carrier wave frequency with a phase component from the baseband unit, an output of the mixer being supplied to the high frequency amplifier.

10. The power amplification apparatus according to claim 1, wherein the control signal generator outputs a binary control signal of a first value when an amplitude component of the input signal is smaller than a specified value, and of a second value when an amplitude component of the input signal is larger than the specified value.

11. The power amplification apparatus according to claim 1 wherein the control signal generator performs pulse modulation of a delta modulation scheme or a sigma-delta modulation scheme, inverses a polarity of a pulse modulated signal, and outputs a binary control signal in which a pulse density of a first value is coarse where an amplitude component of the input signal increases, and a pulse density of a first value is dense where an amplitude component of the input signal decreases.

12. The power amplification apparatus according to claim 1, wherein the control signal generator performs pulse width modulation, inverses a polarity of a pulse modulated signal, and outputs a binary control signal in which a pulse width of a first value is narrow where an amplitude component of the input signal is large, and a pulse width of a first value is large where the amplitude intensity is small.

13. The power amplification apparatus according to claim 1, wherein the power combiner comprises:
a transformer including a primary side coil and a secondary side coil;
the second power supply; and
a switching element connected to the primary side coil of the transformer,
the switching element, responsive to an output from the control signal generator, performing control of conduction and non-conduction of a current flowing from the second power supply to the primary side coil of the transformer,
the first power supply and an output terminal being connected to the secondary side coil of the transformer,
the transformer being connected so that a current flows in a direction of the first power supply from the output terminal side to the secondary side coil, when the primary side coil is made conductive,
the power combiner further comprising:
at least one current path in parallel with the secondary side coil; and
at least one rectifying element that is arranged between the first power supply and the output terminal and rectifies a current in a direction of the first power supply from the output terminal,
an output of the output terminal being used as a power supply of the high frequency amplifier.

14. The power amplification apparatus according to claim 13, wherein the power combiner comprises
a low pass filter that removes a switching frequency component from an output signal of the control signal generator and smoothes a voltage change of the output terminal.

15. The power amplification apparatus according to claim 13, wherein the rectifying element includes a diode.

16. The power amplification apparatus according to claim 13, wherein the rectifying element includes a switch element which is synchronized with the control signal.

17. A power amplification apparatus comprising:
an amplifier that linearly amplifies an input modulated signal;
a control signal generator that receives an amplitude signal of the input modulated signal and generates a binary control signal; and
a power combiner that performs switching amplification, using a second power supply, based on the control signal, and transfers an amplified power in one direction toward a first power supply to obtain a difference power, the power combiner supplying the difference power to the amplifier, as a power supply thereof.

18. The power amplification apparatus according to claim 17, wherein the control signal generator generates the control signal based on whether or not an amplitude intensity of the input modulated signal is less than or equal to a predetermined prescribed value.

19. The power amplification apparatus according to claim 17, wherein the control signal generator performs sampling and pulse modulation of a signal obtained by inverting a change of amplitude intensity of the input modulated signal to generate the control signal.

20. A power amplification method for providing a power supply to an amplifier that performs linear amplification of an input modulated signal, the method comprising:
generating a binary control signal corresponding to an amplitude signal of the input modulated signal, and performing switching amplification, using a second power supply, based on the control signal and transferring an amplified power in one direction toward a first power supply to obtain a difference power, and supplying the difference power to the amplifier as a power supply thereof.

21. The power amplification method according to claim 20, comprising:
   (a) determining whether an amplitude component of the input modulated signal is larger or smaller than a reference signal, and generating a binary control signal taking a first or a second value corresponding to whether the amplitude component is larger or smaller than the reference signal;
   (b) amplifying a power in a pulse form when an amplitude component of the input modulated signal is smaller than the reference signal, by performing ON/OFF control by the control signal of a switching element connected to the second power supply; and
   (c) transferring a power undergoing the switching amplification, in one direction to the first power supply side, obtaining a difference power obtained by subtracting a power supplied in excess when an amplitude component of the input modulated signal is smaller than the reference signal, from a power supplied from the first power supply, and supplying the difference power, as a power supply of the amplifier that amplifies the input modulated signal.

22. The power amplification method according to claim 21, wherein the power subjected to the switching amplification, is transferred from a primary winding side of a transformer to which the switching element is connected, to the first power supply of a secondary winding side, and
   at least one current path in parallel with the secondary winding and at least one rectifying element for rectification in a direction of the first power supply from an output terminal are provided between the output terminal and the first power supply of the secondary winding side.

23. The power amplification method according to claim 22, wherein a difference power is supplied as a power supply to the amplifier,
   the difference power being obtained by smoothing, by a filter, a power generated when a power subjected to the switching amplification on the primary winding side, is transferred in a direction toward the first power supply on the secondary winding side, to be subtracted from power supplied from the first power supply.

24. The power amplification method according to claim 20, comprising:
   (a) generating a binary control signal taking a first or a second value corresponding to whether an amplitude component is larger or smaller than a reference signal;
   (b) amplifying a power in a pulse form when amplitude component of the input modulated signal is smaller than the reference signal, by performing ON/OFF control by the control signal of a switching element connected to the second power supply; and
   (c) transferring a power undergoing the switching amplification, in one direction to the first power supply side, obtaining a difference power obtained by subtracting a power supplied in excess when an amplitude component of the input modulated signal is smaller than the reference signal, from a power supplied from the first power supply, and supplying the difference power, as a power supply of the amplifier that amplifies the input modulated signal,
   wherein, in step (a), a signal obtained by inverting a change of an amplitude intensity of the input modulated signal is pulse-modulated and a binary control signal is output.

25. The power amplification method according to claim 24, wherein in step (a), in a case where a pulse modulation scheme is PWM (Pulse Width Modulation),
   a binary control signal is output in which a pulse width of a first value is narrow where amplitude intensity of the input modulated signal is large, and a pulse width of a first value is large where amplitude intensity is small,
   in a case where the pulse modulation scheme is PDM (Pulse Density Modulation) a binary control signal is output in which a pulse density of a first value is coarse where an amplitude of the input modulated signal increases, and a pulse density of a first value is dense where an amplitude decreases, and
   in step (b), by performing ON/OFF control of the switching element using the control signal, switching amplification is performed on a pulse power, to which modulation inverting amplitude intensity has been applied.

* * * * *